United States Patent
Okwudire et al.

(10) Patent No.: US 10,281,829 B2
(45) Date of Patent: May 7, 2019

(54) VIBRATION-ASSISTED POSITIONING STAGE

(71) Applicant: THE REGENTS OF THE UNIVERSITY OF MICHIGAN, Ann Arbor, MI (US)

(72) Inventors: Chinedum E. Okwudire, Ann Arbor, MI (US); Xin Dong, Ann Arbor, MI (US)

(73) Assignee: THE REGENTS OF THE UNIVERSITY OF MICHIGAN, Ann Arbor, MI (US)

(*) Notice: Subject to any disclaimer, the term of this patent is extended or adjusted under 35 U.S.C. 154(b) by 0 days.

(21) Appl. No.: 15/528,695

(22) PCT Filed: Dec. 16, 2015

(86) PCT No.: PCT/US2015/066105
§ 371 (c)(1),
(2) Date: May 22, 2017

(87) PCT Pub. No.: WO2016/106047
PCT Pub. Date: Jun. 30, 2016

(65) Prior Publication Data
US 2017/0277041 A1  Sep. 28, 2017

Related U.S. Application Data (60) Provisional application No. 62/095,155, filed on Dec. 22, 2014.

(51) Int. Cl.
*G03F 7/20* (2006.01)

(52) U.S. Cl.
CPC ........ *G03F 7/70725* (2013.01); *G03F 7/709* (2013.01); *G03F 7/70716* (2013.01); *G03F 7/70766* (2013.01); *G03F 7/70816* (2013.01)

(58) Field of Classification Search
CPC .......... G03F 7/70725; G01C 1/00; G12B 5/00
See application file for complete search history.

(56) References Cited

U.S. PATENT DOCUMENTS

| 6,646,715 B1 * | 11/2003 | Makinouchi ........... G03B 27/42 |
| | | 355/53 |
| 7,872,436 B2 | 1/2011 | Kock et al. |

(Continued)

FOREIGN PATENT DOCUMENTS

| JP | 2003059797 A | 2/2003 |
| JP | 2005010120 A | 1/2005 |

OTHER PUBLICATIONS

Ferreira, Antoine "Optimized Friction Drive Controller for a Multi-DOF Ultrasonic Nanopositioner"; IEEE/ASME Transactions on Mechatronics, vol. 9, No. 3, Sep. 2004, pp. 481-190.

(Continued)

*Primary Examiner* — Deoram Persaud
(74) *Attorney, Agent, or Firm* — Harness, Dickey & Pierce, P.L.C.

(57) ABSTRACT

A vibration-assisted positioning stage comprising a stage, a roller bearing, an compliant joint interconnecting the roller bearing to the stage such that the compliant joint is sufficiently compliant in a direction of movement to permit reliable alignment of the stage and further permit dithering, and a dithering force actuator applying a dithering force directly to the roller bearing to permit the dithering of the stage. The dithering forces can be applied out of phase to minimize vibration of the stage. Furthermore, the controller of the stage can be employed to suppress any remnant vibrations of the stage due to dithering. A supervisory control system can intelligently adapt the parameters of the dithering signal to optimize the performance of the stage as friction changes.

17 Claims, 8 Drawing Sheets

(56) References Cited

U.S. PATENT DOCUMENTS

| | | | |
|---|---|---|---|
| 8,894,052 B2* | 11/2014 | Heiland | F16F 15/002 |
| | | | 267/136 |
| 9,664,562 B1* | 5/2017 | Goodnough | H04N 5/2251 |
| 9,720,335 B2* | 8/2017 | Sakata | G05B 19/402 |
| 9,766,614 B2* | 9/2017 | Nakamura | G05B 19/404 |
| 2002/0074516 A1 | 6/2002 | Novak et al. | |
| 2002/0097925 A1 | 7/2002 | Kafai | |
| 2003/0040831 A1 | 2/2003 | Tanaka et al. | |
| 2005/0012920 A1* | 1/2005 | Jeanne | G03B 27/58 |
| | | | 355/72 |
| 2005/0018283 A1 | 1/2005 | Kimura | |
| 2005/0280799 A1 | 12/2005 | Tanaka et al. | |
| 2008/0315928 A1* | 12/2008 | Waheed | G04F 10/005 |
| | | | 327/159 |
| 2009/0125242 A1* | 5/2009 | Choi | G01N 21/45 |
| | | | 702/19 |
| 2011/0193510 A1 | 8/2011 | Fleming | |
| 2016/0003740 A1* | 1/2016 | Tao | G01N 21/45 |
| | | | 250/459.1 |
| 2017/0089506 A1* | 3/2017 | Okwudire | G03F 7/70758 |
| 2018/0149855 A1* | 5/2018 | Chou | G02B 27/32 |

OTHER PUBLICATIONS

Liu, Yung-Tien et al. "Pneumatic Actuating Device With Nanopositioning Ability Utilizing PZT Impact Force Coupled With Differential Pressure"; Precision Engineering, vol. 31 (2007), pp. 293-303.
International Search Report and Written Opinion for PCT/US2015/066105, dated Mar. 30, 2016; ISA/KR.

* cited by examiner

VIBRATION-ASSISTED POSITIONING STAGE

CROSS-REFERENCE TO RELATED APPLICATIONS

This application is a U.S. National Phase Application under 35 U.S.C. 371 of International Application No. PCT/US2015/066105 filed on Dec. 16, 2015 and published as WO 2016/106047 A1 on Jun. 30, 2016. This application is based on and claims the benefit of U.S. Provisional Application No. 62/095,155, filed on Dec. 22, 2014. The entire disclosures of the above applications are incorporated herein by reference.

FIELD

The present disclosure relates to a positioning stage and, more particularly, relates to a vibration-assisted positioning stage.

BACKGROUND AND SUMMARY

This section provides background information related to the present disclosure which is not necessarily prior art. This section also provides a general summary of the disclosure, and is not a comprehensive disclosure of its full scope or all of its features.

Positioning stages, such as nanopositioning and micropositioning, are used in a variety of high-tech applications to deliver motion at nanometer-level precision. Of the various nanopositioning stage types available, those that use friction bearings are gaining in popularity because they are cost-effective, vacuum and cleanroom compatible, and have large motion ranges. However, a major problem they have is that of poor settling time. The non-linear friction that prevails in micron-level motions causes them to take a prohibitively long amount of time to settle to a desired position. Friction compensation methods that are most commonly used to solve this problem are not reliable because of the very temperamental nature of friction. The present teachings address the problem of poor settling time due to friction by using vibration assistance to provide robust improvements to the settling speed of friction-bearing-based nanopositioning stages.

In some embodiments according to the principles of the present teachings, a vibration-assisted positioning stage is provided having a stage, at least one roller bearing, an elastic joint interconnecting the at least one roller bearing to the stage such that the elastic joint is sufficiently compliant in the motion direction to permit dithering, but sufficiently stiff in the non-motion directions to permit reliable alignment, and a dithering force actuator applying a dithering force directly to the at least one roller bearing to permit the dithering of the stage.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise.

The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The present disclosure provides vibration-assisted nanopositioning (VAN)—a novel approach for mitigating the adverse effects of pre-rolling friction on the settling time of roller bearing nanopositioning stages using high frequency vibration. The novelty of VAN is in the way it synergistically combines the mechanical design and control of the stage to mitigate pre-rolling friction without jeopardizing positioning precision. After a brief introduction, the concept of VAN is described and its superior performance and robustness relative to a recently-proposed friction compensation method is demonstrated in simulations. The design of a prototype VAN stage is then outlined, and the prototype stage is used in preliminary experiments to demonstrate up to 61.7% reduction of settling time compared to a stage without VAN.

Background and Motivation

Nanopositioning (NP) stages are used for precise positioning in a wide range of ultra-precision processes, ranging from MEMS inspection to micro additive manufacturing. They can be constructed using flexure, fluidic, magnetic or roller bearings. Flexure-based stages are compact, low-cost and friction free. However, their limited stroke and load capacity make them unsuitable for large-range, medium-to-high-payload applications e.g., nanoimprint lithography. Magnetic bearings are capable of large range nanopositioning but their commercial use is currently relegated to the highest end stages (such as those used in semiconductor manufacturing) because of their high costs and complexities. Fluidic (i.e., hydrostatic or aerostatic) bearings are also capable of large-range nanopositioning but they are not suitable for clean room and/or high vacuum environments.

Roller bearing NP (RB-NP) (i.e., crossed roller and linear ball bearing) stages are the most cost effective type of NP stages. Moreover, they are currently the only commercially viable option for a growing number of large-range NP applications that must be performed in high or ultra-high vacuum environments, e.g., scanning electron microscopy and focused ion beam. However, the presence of friction adversely affects their performance. A typical RB-NP stage takes a very long time to reach its target position in point-to-point positioning due to the so-called "pre-rolling friction," which dominates as the stage gets within microns of its target position. Such long settling times severely hamper the throughput of the processes for which RB-NP stages are used.

The state of art in addressing friction in RB-NP stages is to perform model-based friction compensation through feed forward or feedback controllers. Friction compensation works well if the friction model is sufficiently accurate. However, due to the extreme variability of friction dynamics, particularly in the pre-rolling regime, such methods typically suffer from poor robustness. Several methods have been proposed in the literature for improving the robustness of friction compensation, mainly through model parameter adaptation. However, the convergence of adaptation schemes is often difficult and slow because the identification signals are not rich (or persistent) enough. Another approach is to use a feedback controller with very good rejection of un-modeled or poorly modeled disturbances. The result is often a high gain or nonlinear controller which could lead to instability or undesirable limit cycles.

Figure 1A:
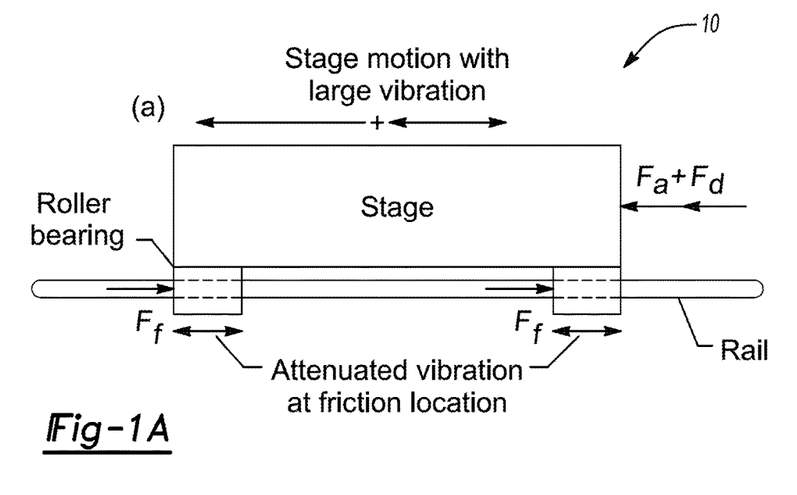
FIG. 1A is a schematic view of a nanopositioning stage according to the prior art.

Dither is well-known to be an effective and robust way of mitigating nonlinear phenomena like friction, backlash and hysteresis. For dither to work effectively, the frequency and amplitude of oscillations must be high. Therefore, when considering dither for friction mitigation in RB-NP stages, the following problems emerge:

Traditionally, the dithering force ($F_d$) is applied indirectly to the location of friction ($F_f$) by adding it to the servo actuation force ($F_a$) of the stage (see FIG. 1A). However, the effectiveness of dither is greatly attenuated by the low-pass filtering effect resulting from the stage dynamics.

Applying high amplitude dither to a precise positioning stage through its servo actuator causes excessive vibration of the stage thus jeopardizing its positioning performance; there is no guarantee that the stage will stop at the desired position after dither is turned off.

When high amplitude dither is maintained for prolonged periods of time, it causes accelerated wear of mechanical components and excessive heat generation.

Vibration-Assisted Nanopositioning Concept

Figure 1B:
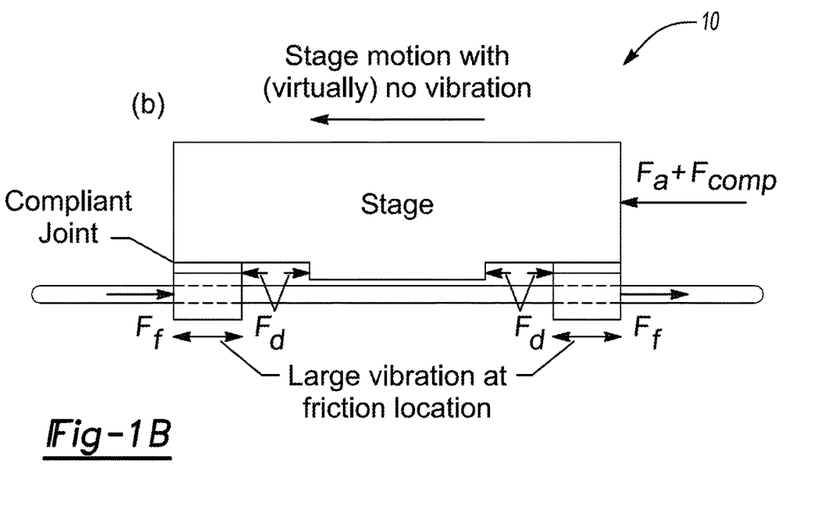
FIG. 1B is a schematic view of a vibration-assisted nanopositioning (VAN) stage according to the principles of the present teachings.

To address the limitations of traditional dithering, the present teachings provide a novel approach of applying dither to RB-NP stages, referred to as vibration-assisted nanopositioning (VAN) herein. As shown in FIG. 1(b), it comprises the following features:

Each roller bearing is not rigidly attached to the stage; rather it is attached using a joint that is compliant in the stage's direction of motion but stiff in other directions. In some embodiments, the joint is 10-100 times more compliant in the stage's direction of motion (i.e. axial direction) than in other directions of motion orthogonal to the axial direction (i.e. lateral and vertical directions). In some embodiments, the joint is about 50 times more compliant in the motion direction than in the other aforementioned directions. However, the compliancy may vary by application. In some embodiments, the stiffness in the lateral and vertical directions should be higher or at least in the same order of magnitude as the roller bearing itself such that the stiffness of the combined flexure and roller bearing structure is about the same level as the roller bearing stiffness.

$F_d$ is applied directly to each roller bearing using a small actuator (e.g., voice coil or piezo stack) to create large enough vibration amplitudes at the location of friction.

$F_d$ is applied with a phase difference of 180° to the bearings on opposite ends of the stage such that the reaction forces transmitted to the stage substantially cancel out.

The adverse effects of un-cancelled vibration, heat, and wear are minimized by regulating the applied dither force and/or by applying a compensating force (Fcomp) through the actuator of the stage.

Simple Model of VAN Stage

Figure 2:
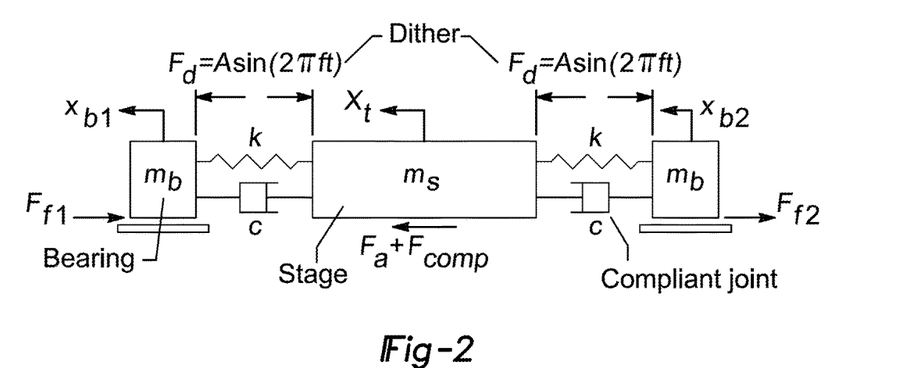
FIG. 2 is a three-mass model of the VAN stage according to the principles of the present teachings.

FIG. 2 shows a simple three-mass model of a closed-loop controlled VAN stage according to the principles of the present teachings. The compliant joint connecting the stage of mass ms to each bearing of mass mb is modeled by spring stiffness k and damping coefficient c. Dither is applied in the form of a harmonic or a non-harmonic excitation force $F_d$, with amplitude A and frequency f. The system dynamics are described by:

$$M\ddot{u} + C\dot{u} + Ku = F, \quad (1)$$

where M, C, and K are respectively the mass, damping, and stiffness matrices, while u and F are respectively the displacement and force vectors of the system. They are given by:

$$M = \begin{bmatrix} m_b & 0 & 0 \\ 0 & m_b & 0 \\ 0 & 0 & m_s \end{bmatrix}, C = \begin{bmatrix} c & 0 & -c \\ 0 & c & -c \\ -c & -c & 2c \end{bmatrix}, \quad (2)$$

$$K = \begin{bmatrix} k & 0 & -k \\ 0 & k & -k \\ -k & -k & 2k \end{bmatrix}, F = \begin{Bmatrix} F_d - F_{f1} \\ -F_d - F_{f2} \\ F_a \end{Bmatrix}, u = \begin{Bmatrix} x_{b1} \\ x_{b2} \\ x_s \end{Bmatrix},$$

where $x_b$ and $x_s$ are respectively the displacements of stage and bearings. The subscripts 1 and 2 attached to $F_f$ and $x_b$ are used to distinguish between the displacements and friction forces of each bearing, which may be different.

Simulation Based Analysis of VAN

VAN is evaluated in simulations by comparing its settling performance with that of the Nonlinear Integral Action Settling Algorithm (or NIASA for short) proposed by Bucci et al. In Bucci et al., a PID controlled Aerotech ALS-130H RB-NP stage with total moving mass m=1.5 kg is used to evaluate NIASA in simulations. Its P and D gains are respectively 0.8 N/μm and 8.5×10−4 N·s/μm, but its integral gain is a nonlinear function of the friction force Ff, assumed to be described by the Dahl model, given by:

$$\frac{dF_f}{dx_r} = \sigma\left(1 - \frac{F_f}{F_c}\operatorname{sgn}\dot{x}_r\right)^i, \quad (3)$$

where $x_r$ is the relative displacement between the sliding surfaces, σ=8 N/μm is the initial stiffness, $F_c$=1 N is a measure of the Coulomb friction force, and i=1 is a shape factor.

To compare with NIASA, a PID controlled VAN stage is modeled as shown in FIG. 2, with $m_s$=1 kg, $m_b$=0.25 kg, k=5 N/μm, c=2×10−5 N·s/μm (corresponding to 1% damping ratio) and $F_{f1}=F_{f2}=F_f$. Note that the total mass of the VAN stage (i.e., $m=m_s+2m_b$), its P and D controller gains, and its frictional force parameters are exactly the same as used for NIASA in Bucci et al., as described in the preceding paragraph. A regular integral gain of 1 N/(s·μm) is used for VAN (as opposed to the nonlinear integral action used in NIASA).

TABLE 1

Figure 3:
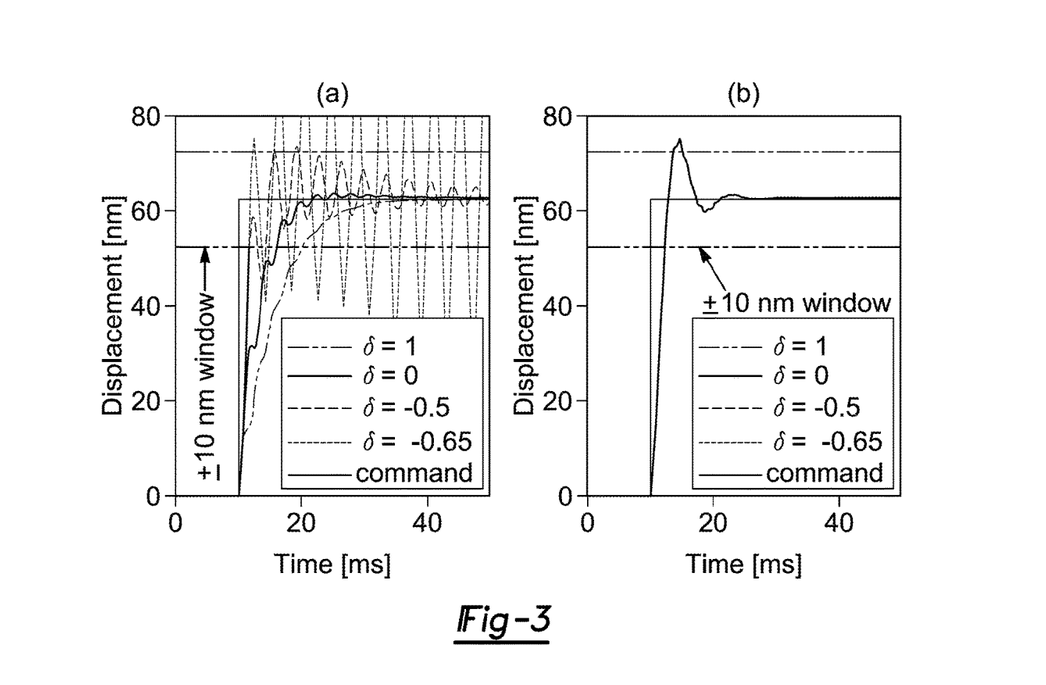
FIG. 3A is a graph illustrating the settling time of NIASA in response to a 62.5 nm step command using different values of initial contact stiffness in the Dahl model.
FIG. 3B is a graph illustrating the settling time of VAN in response to a 62.5 nm step command using different values of initial contact stiffness in the Dahl model (note that A=3N and f=500 Hz for VAN)

Comparison of settling times of NIASA and VAN into the ± 10 nm window shown in FIG. 3 for various values of δ.

| | Settling Time (ms) | | | |
|---|---|---|---|---|
| Method | δ = 1 | δ = 0 | δ = −0.5 | δ = −0.65 |
| NIASA | 10.3 | 6.2 | 9.5 | N/A |
| VAN | 5.2 | 5.2 | 5.1 | 5.1 |

FIG. 3 compares the settling responses of NIASA and VAN to a 62.5 nm step command used by Bucci et al.; a ±10 nm window is used as the settling window. A multiplicative uncertainty parameter δ∈[−1, ∞) is introduced by Bucci et al. into the contact stiffness σ of the Dahl model described by Eq. (3) to help demonstrate the robustness of NIASA to changing friction. It is observed that NIASA is indeed stable within the parameter band δ∈[−0.5, 1] that is presented in Bucci et al. However, its settling performance varies significantly as δ deviates from its nominal value of zero as shown in FIG. 3(a). Notice that the system with NIASA experiences severe oscillations for δ=−0.5, and suffers from a limit cycle with large amplitude for δ=−0.65, causing it to not settle. On the other hand, as shown in FIG. 3(b), VAN (with A=3 N and f=500 Hz) demonstrates remarkable robustness and settling performance in the presence of varying friction.

Figure 4:
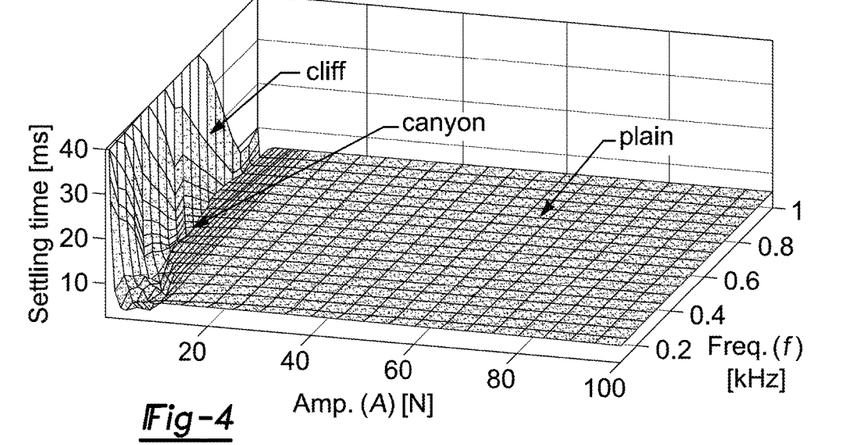
FIG. 4 is a graph illustrating the effect of dither amplitude (A) and frequency (f) on settling time for VAN stage.

It is of interest to study the effect of A and f on the settling performance of VAN. FIG. 4 shows the settling times of VAN as functions of A and f for the same test case as in FIG. 3 (with δ=0). The settling time characteristics can have a cliff, a canyon, and a plain. At very low amplitudes and frequencies, the addition of dither produces little or no effect in reducing settling time. But beyond a certain critical frequency, there is a sudden drop in settling time over the cliff to its lowest levels (i.e., the canyon). It is observed that this critical frequency mainly depends on A. As A (and to some extent f) is increased further, the settling time increases slightly after which it remains largely unchanged (i.e., the plain). In terms of robustness, the plain is excellent because it provides a wide range of A and f values to choose from without losing performance. The problem is that the plain occurs at relatively higher A or f values, which could pose challenges with regard to heat generation and bearing wear. The canyon provides optimal settling times at relatively lower A and f values than the plain. Therefore, operating within the canyon region could provide huge benefits with regard to the reduction of heat and wear. However, the challenge is that the canyon is very narrow and close to the cliff; settling times could rise sharply (up to 5 times in FIG. 4) if the critical amplitude or frequency is crossed.

In the results presented in FIGS. 3(b) and 4, because $F_{f1}=F_{f2}=F_f$ is assumed, the reaction forces due to dithering perfectly cancel out, leading to zero vibration at the stage. If $F_{f1} \neq F_{f2}$, unequal reaction forces are generated and the stage experiences continuous vibration which may cause it to not settle. As discussed in the previous section, such unwanted vibration can be mitigated by regulating the applied dither and/or by injecting a compensating force $F_{comp}$ via the stage's servo controller. In preliminary work, we evaluated a simple regulation technique where dither is applied and then suddenly turned off after duration T, starting when the reference command reaches the target position. Such an approach is suitable for point-to-point positioning tasks where high precision is only required after the target position is reached.

Figure 5:
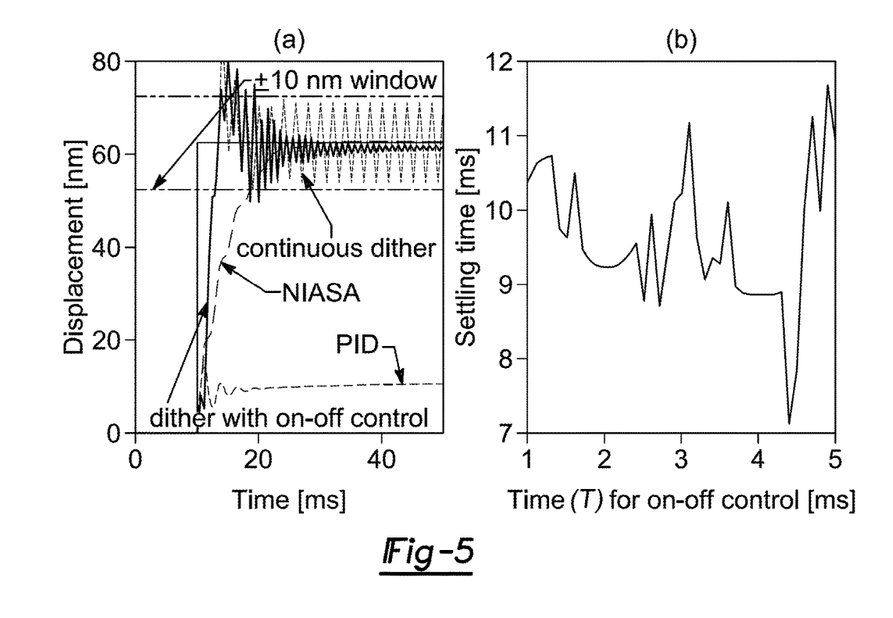
FIG. 5A is a graph illustrating the displacement and settling results of VAN in response to a 62.5 nm step command with imperfect cancellation of dithering reaction forces (compare with FIG. 3B)
FIG. 5B is a graph illustrating the effect of time (T) on the settling time for VAN.

Let us re-consider the scenario shown in FIG. 3(b) for VAN, but with δ=1 for $F_{f1}$ and δ=0 for $F_{f2}$. FIG. 5(a) compares the settling behavior of NIASA and VAN with and without on-off dither control to that of a regular PID controlled stage. Notice that without on-off dither control, VAN stage settles into the ±10 nm window in 9.3 ms while NIASA settles in 8.7 ms, which are both huge improvements compared to the regular PID which does not settle within the simulation time of 50 ms. However, because of the imperfect cancellation of reaction forces, VAN continues to vibrate as long as dither is maintained. The lingering vibration can be eliminated by shutting off dither as shown in the figure for T=3 ms. Notice, however, that on-off control introduces some transients before the vibration dies down completely. The transient vibration could be reduced by making the on-off control less abrupt or if the stage has extra damping (as will be seen later in the experiments).

FIG. 5(b) shows the settling times of VAN with on-off control for various values of T ranging from 1 to 5 ms. The observed fluctuation in settling time as T changes is partly due to the aforementioned transient vibration as well as the fact that the stage is at different positions (relative to the target position) when dither is turned off. Nonetheless, the deformed springs provide extra forces to overcome pre-rolling friction after dither is turned off, leading to much faster settling of the stage to the target position compared to the regular PID.

Design and Validation

A prototype VAN stage 10 is provided according to the principles of the present teachings. FIGS. 6A-6F illustrate VAN stage 10 according to the principles of the present teachings. It should be understood that variations in design are anticipated depending on particular application. Notwithstanding, according to some embodiments, VAN stage 10 can comprise table 12 for supporting a component to be positioned. Table 12 can be indirectly mounted to one or more roller bearings 14 via one or more flexures or compliant joints 16. That is, flexures 16 are disposed between table 12 and roller bearings 14 to isolate table 12 from roller bearings 14. Roller bearings 14 are operably coupled to a rail 18 for linear movement therealong. One or more bumper mounts 20 can be disposed at opposing ends of rail 18 to inhibit movement of roller bearings 14, flexures 16, and table 12 along rail 18. A linear motor 22 and magnetic track 24 can be provided for actuating table 12 along rail 18. Magnetic track 24 can be coupled to a base 26. Base 26 can provide mounting support for a scale mount 28, encoder mount 30, encoder readhead 32, carrier mounts 34, and cable carrier 36.

Figure 6A:
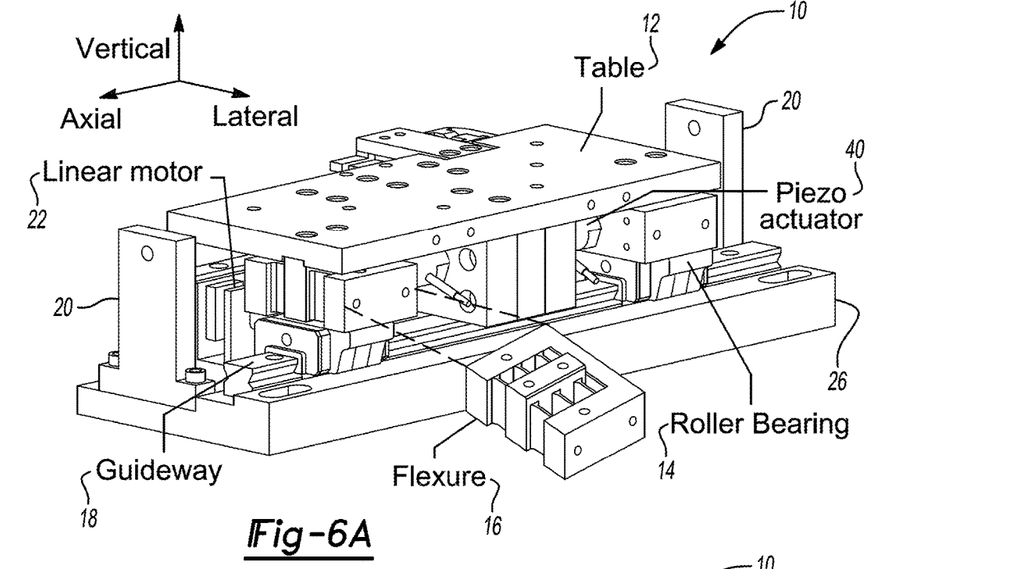
FIG. 6A is a perspective view of a VAN stage according to the principles of the present teachings, having the flexure removed for clarity.
Figure 6B:
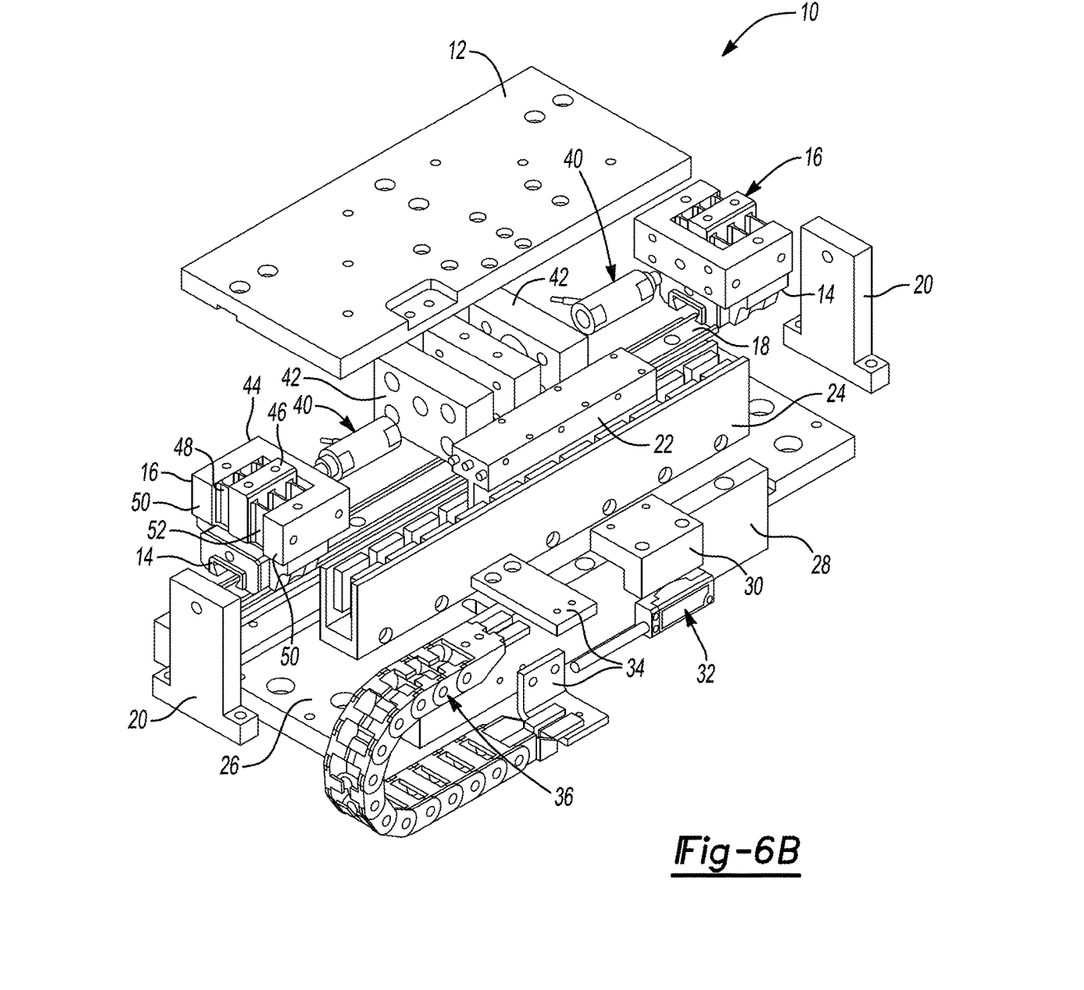
FIG. 6B is an exploded perspective view of the VAN stage according to the principles of the present teachings.
Figure 6C:
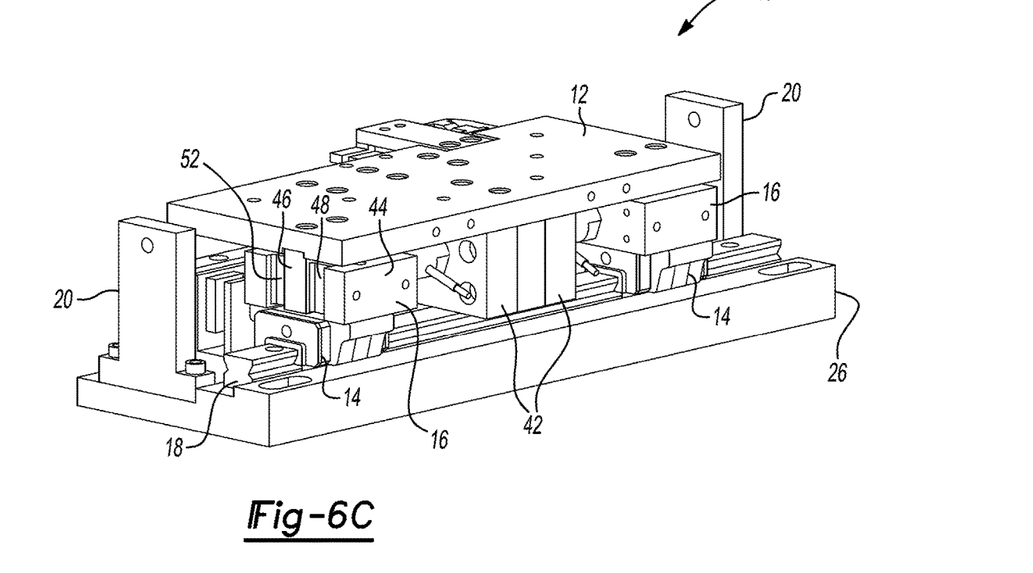
FIG. 6C is a perspective view of the VAN stage according to the principles of the present teachings.
Figure 6D:
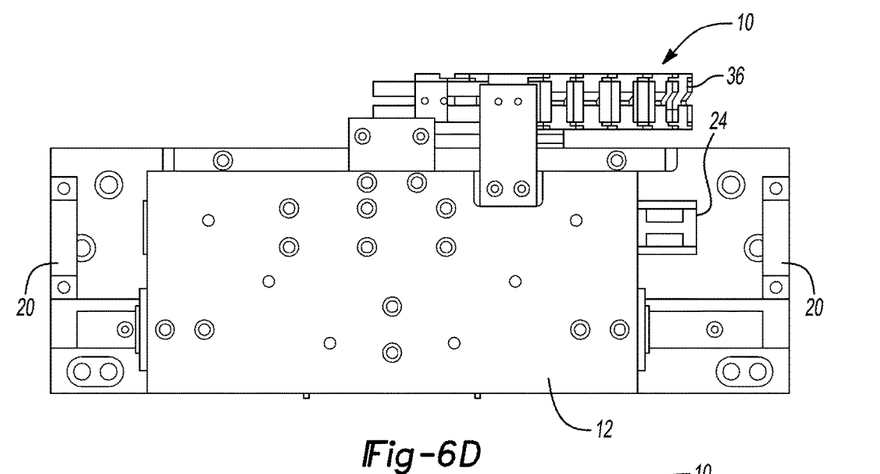
FIG. 6D is a top view of the VAN stage according to the principles of the present teachings.
Figure 6E:
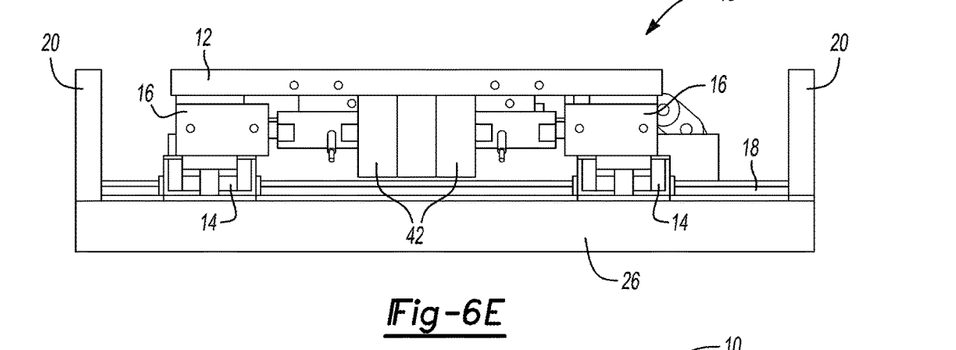
FIG. 6E is a front view of the VAN stage according to the principles of the present teachings.
Figure 6F:
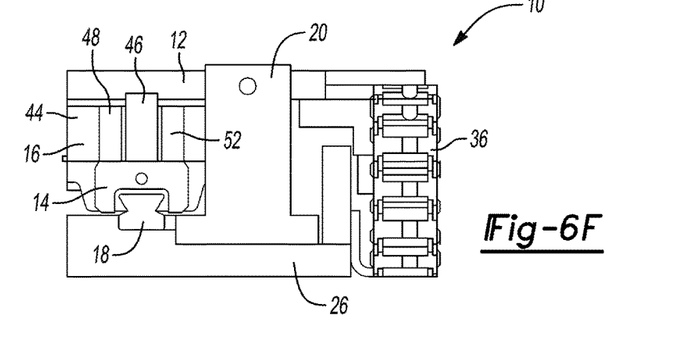
FIG. 6F is an end view of the VAN stage according to the principles of the present teachings.

With continued reference to FIGS. 6A-6F, VAN stage 10 further includes one or more dithering force actuators, such as piezo actuators, 40 mounted to each flexure 16 to apply a dither force, as described herein, to flexure 16. Actuator 40 is mounted between a piezo mount 42 mounted to table 12 and flexure 16. In some embodiments, as illustrated in FIG. 6B, flexure 16 is configured having a generally U-shaped outer member 44, an elongated inner member 46 disposed within outer member 44, and one or more compliant members 48 interconnecting outer member 44 and inner member 46. More particularly, flexure 16 is configured to permit compliant movement in an axial direction (direction of stage movement) and inhibit compliant movement in vertical and lateral directions (perpendicular to stage movement). To this end, in some embodiments, U-shaped outer member 44 can define legs 50 extending parallel to the axial direction. Compliant members 48 can define wafer-like members being disposed such that its major surface 52 is parallel to the vertical and lateral directions and mounted between legs 50 and inner member 46. Actuators 40 can be mounted to exert the dither force against outer member 44, thereby applying the dithering force directly to outer member 44 of flexure 16 and roller bearing 14.

For validation, VAN stage 10 was configured having a moving mass of about 2 kg and a travel range of 50 mm. The stage is guided by a set of high-rigidity radial type linear ball bearings 14, riding on a super-precision grade rail 18. An ironless linear motor 22 with 23 N continuous force is selected to drive the stage. The table position is measured using a 4.88 nm-resolution linear encoder. A pair of preloaded piezo actuators 40 is selected to provide the dither force; each actuator has a travel range and blocking force of up to 15 μm and 300 N, respectively, with a maximum operating frequency of 6000 Hz.

A flexure hinge 16, made of AISI 304 stainless steel, is used to connect the table 12 to each of the roller bearing 14. Its role is to provide sufficient compliance in the direction of dithering while remaining rigid in other directions. Table 2 compares its stiffness values in different directions (obtained using SolidWorks® finite element analysis) with those of the linear bearing. In some embodiments, the stiffness in the off-axis directions (i.e. lateral and vertical) is generally equal to the stiffness in the off-axis directions of the roller bearing. In the axial direction, it should be 10-100 times smaller than those in the off-axis directions With an axial rigidity of 6.9 N/μm, the flexure 16 can provide around 11 μm of displacement (with 77 N force) at the maximum operating voltage of the piezo actuators 40 (i.e., 100 V). Notice from Table 2 that the vertical and lateral stiffness of the flexure 16 are much higher than its axial stiffness. As described herein, in some embodiments, the vertical and lateral stiffness of the flexure 16 is generally about 10-100 times greater than the stiffness in the axial direction. As a result, the combined stiffness of the flexure 16 and linear bearing 14 in the vertical and lateral directions have same order of magnitude as those of the linear bearing alone. It is important to note that at an applied load of 77 N, the highest maximum von Mises stress of the flexure is 43 MPa, which is much lower than the endurance limit (203 MPa) of 304 stainless steel. So, even at its worst-case loading, infinite fatigue life is guaranteed for the flexure.

TABLE 2

Stiffness of linear ball bearing and flexure (N/μm).

|  | Axial | Vertical | Lateral |
| --- | --- | --- | --- |
| Bearing | N/A | 175 | 58.3 |
| Flexure | 6.9 | 310 | 331 |
| Combined | 6.9 | 111.9 | 49.6 |

Figure 7:
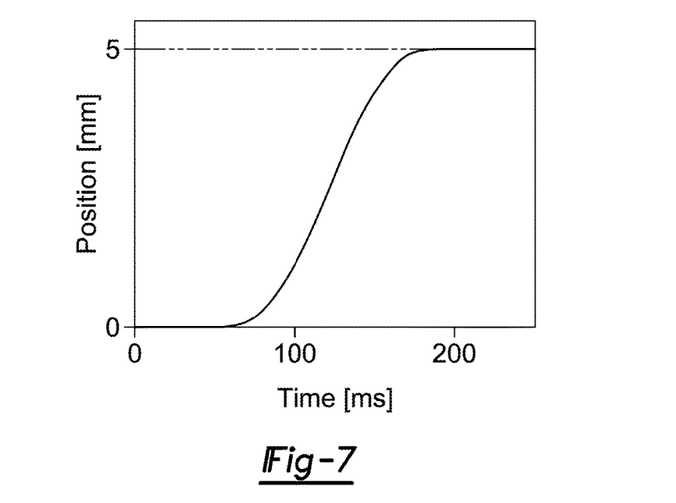
FIG. 7 is a graph illustrating position versus time of a typical 5 mm "move-and-settle" profile.

A typical 5 mm "move-and-settle" profile is used as the reference trajectory as shown in FIG. 7. It has maximum acceleration/deceleration of 1500 mm/s$^2$ with a maximum velocity of approximately 70 mm/s. Only the settling portion, after the target position is reached, is considered in the present disclosure. A PID controller with velocity and acceleration feed forward is used to control the stage. The PID controller is tuned to achieve a closed loop bandwidth of about 195 Hz. It is implemented using a real time controller (dSPACE, DS1007) with current commands sent through a PWM amplifier. The two piezo actuators are controlled in open loop by sending sinusoidal commands through their voltage amplifiers.

Figure 8:
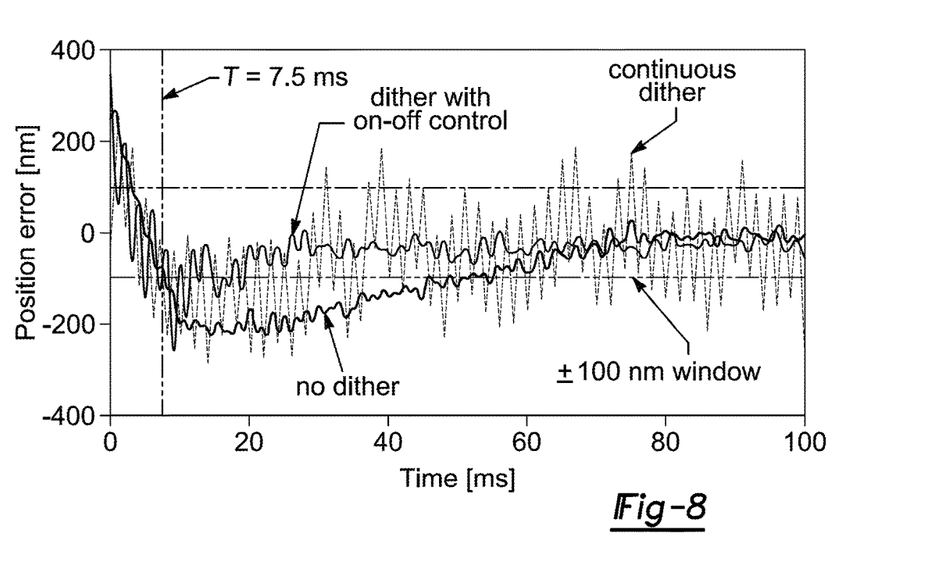
FIG. 8 is a graph illustrating the settling time of no dither, continuous dither, and dither with on-off control (T=7.5 ms)

The friction behavior of the prototype stage has been found to not conform to the Dahl model, so NIASA is not a suitable benchmark for experiments. Therefore, the performance of VAN is evaluated in experiments by studying the settling behavior of the prototype stage with and without dither. FIG. 8 compares the settling performance of the stage into a 100 nm window with and without dither. Without dither, the stage takes 55.1 ms to settle. Dither with peak-to-peak amplitude of 20 V (corresponding to 15 N) at 500 Hz is added and, as expected, the stage experiences steady state vibrations due to imperfect cancellation of the reaction forces. The imperfect cancellation of reaction forces is caused by non-idealities in the stage, like differing friction forces on each bearing and slight differences in the performance of each piezo actuator and amplifier. The on-off control used in the simulations is applied (with T=7.5 ms), causing the stage with dither to settle within 19.4 ms, which is 64.8% shorter than the case without dither. Notice that no significant transients are generated by the abrupt switching; this is in part due to the higher damping provided by the roller bearings, compared to the model used in simulations.

Figure 9:
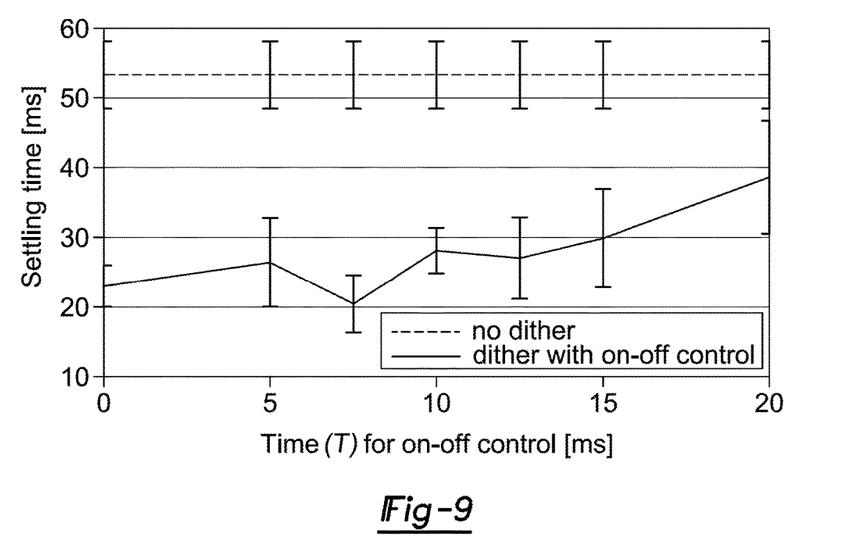
FIG. 9 is a comparison of mean settling times into the +/−100 nm window for no dither and on-off controlled dither with different time (T).

FIG. 9 plots the settling performance of the prototype stage with on-off dither control for various values of T, in comparison with the case without dither. It is observed that with and without dither, the settling performance of the stage varies a bit, due to differences in friction from position to position along the travel of the stage. The plots in FIG. 9 show the mean settling times based on 20 trials at random positions of the table within its travel range; the error bars indicate one standard deviation. Without dithering, the mean settling time is 53.3 ms with a standard deviation of 4.8 ms, which shows the slow settling performance in comparison with the length of the reference trajectory (i.e., 100 ms). With on-off control, the stage with dither is able to achieve a mean settling time of 20.4 ms at T=7.5 ms (with a standard deviation of 4.1 ms), which is 1.7% less than the case without dither. Apart from this optimal value, notice that with dither, the system performs consistently better than the no-dither case for all values of T. Moreover, the proposed method is robust, considering that the stage is at random positions when dither is turned off for each trial.

CONCLUSION

According to the principles of the present teachings, a novel approach for improving settling performance of roller bearing nanopositioning stages using high-frequency vibration (or dither) has been presented; it is called vibration-assisted nanopositioning (VAN). It has been shown using simulations that VAN achieves superior performance and robustness compared to a model based friction compensation. A prototype VAN stage has been designed and built. Preliminary experiments conducted using the designed prototype (with a rudimentary on-off dither control technique) have demonstrated up to 61.7% reduction in mean settling time in point-to-point positioning.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A vibration-assisted stage comprising:
a base having a rail;
a stage;
a roller bearing slidably coupled to the rail for movement in an axial direction;
a compliant joint interconnecting the roller bearing to the stage, the compliant joint being compliant in the axial direction to permit dithering of the stage; and
a dithering force actuator applying a dithering force directly to the roller bearing to permit the dithering of the stage via the compliant joint.

2. The vibration-assisted positioning stage according to claim 1 wherein the roller bearing comprising a pair of roller bearings slidably coupled to the rail for movement in the axial direction.

3. The vibration-assisted positioning stage according to claim 1 wherein the compliant joint comprises a flexure bearing.

4. The vibration-assisted positioning stage according to claim 1 wherein the compliant joint comprises a first member coupled to roller bearing, a second member coupled to the stage, and one or more compliant members interconnecting the first member and the second member.

5. The vibration-assisted positioning stage according to claim 4 wherein the one or more compliant members comprises a plurality of wafer-like members coupled between the first member and the second member.

6. The vibration-assisted positioning stage according to claim 4 wherein each of the plurality of wafer-like members provides compliant movement in the axial direction and inhibits compliant movement in directions perpendicular to the axial direction.

7. The vibration-assisted positioning stage according to claim 4 wherein the dithering force actuator exerts a dithering force directly to the first member of the compliant joint coupled to the roller bearing.

8. The vibration-assisted positioning stage according to claim 1, further comprising;
  a control system operably coupled to the dithering force actuator, the control system applying a control signal to the dithering force actuator to applying the dithering force.

9. The vibration-assisted positioning stage according to claim 8 wherein the control system applies the control signal to the dithering force actuator using vibration isolation techniques to isolate the dithering force from the stage.

10. The vibration-assisted positioning stage according to claim 9 wherein the vibration isolation technique is an out of phase isolation technique.

11. The vibration-assisted positioning stage according to claim 9 wherein the vibration isolation technique uses the control system to intelligently adapt frequency and/or amplitude of the dithering force to enhance the robust performance of the stage platform in the presence of varying frictional dynamics.

12. The vibration-assisted positioning stage according to claim 1 wherein the combined stiffness of the compliant joint and the roller bearing in first direction perpendicular to the axial direction and a second direction perpendicular to the axial direction is the same order of magnitude of the stiffness of the roller bearing alone in the first direction and the second direction.

13. The vibration-assisted positioning stage according to claim 1 wherein the stage has a maximum travel distance of 50 mm or less.

14. A method of applying a dithering force to a positioning stage, the method comprising:
  providing a base having a rail, a stage, a roller bearing slidably coupled to the rail for movement in an axial direction, a compliant joint interconnecting the roller bearing to the stage, the compliant joint being compliant in the axial direction to permit dithering of the stage, and a dithering force actuator; and
  actuating the dithering force actuator to apply a dithering force directly to the roller bearing to permit the dithering of the stage.

15. The method according to claim 14 wherein the actuating the dithering force actuator comprises actuating the dithering force actuator to apply an out of phase force to the compliant joint.

16. The method according to claim 14, further comprising;
  using a control system to detect and suppress vibration of the stage using the dithering force.

17. The method according to claim 16 wherein the control system intelligently adapting frequency and/or amplitude of the dithering force to enhance the robust performance of the stage platform in the presence of varying frictional dynamics.

* * * * *